US005806319A

United States Patent [19]
Wary et al.

[11] Patent Number: 5,806,319
[45] Date of Patent: Sep. 15, 1998

[54] METHOD AND APPARATUS FOR CRYOGENICALLY COOLING A DEPOSITION CHAMBER

[76] Inventors: John Wary, 119 Cherokee La., Noblesville, Ind. 46060; Roger A. Olson, 313 George St., Amery, Wis. 54001; William F. Beach, 1007 Severin Dr., Bridgewater, N.J. 08807; Walter Swanson, 47 Haytown Rd., Lebanon, N.J. 08833

[21] Appl. No.: 816,295

[22] Filed: Mar. 13, 1997

[51] Int. Cl.⁶ .................................................. B01D 8/00
[52] U.S. Cl. ............................................ 62/55.5; 417/901
[58] Field of Search .............................. 62/55.5; 417/901

[56] References Cited

U.S. PATENT DOCUMENTS

| | | |
|---|---|---|
| 3,211,128 | 10/1965 | Potter et al. . |
| 3,246,627 | 4/1966 | Loeb et al. . |
| 3,262,279 | 7/1966 | Moore, Jr. ................................. 62/55.5 |
| 3,301,707 | 1/1967 | Loeb et al. . |
| 3,310,955 | 3/1967 | Sneden, Jr. et al. ...................... 62/55.5 |
| 3,360,949 | 1/1968 | Blanchard et al. ........................ 62/55.5 |
| 3,364,654 | 1/1968 | Westbrook .............................. 62/55.5 |
| 3,371,499 | 3/1968 | Hagenbach et al. ...................... 62/55.5 |
| 3,472,795 | 10/1969 | Tittmann et al. . |
| 3,554,512 | 1/1971 | Elliott . |
| 3,570,449 | 3/1971 | Blecherman . |
| 3,573,968 | 4/1971 | Loeb . |
| 3,600,216 | 8/1971 | Stewart . |
| 3,667,424 | 6/1972 | Cornelius et al. . |
| 3,670,693 | 6/1972 | Rorick et al. . |
| 3,712,074 | 1/1973 | Boissin ................................... 62/55.5 |
| 3,747,558 | 7/1973 | Harel . |

FOREIGN PATENT DOCUMENTS

| | | |
|---|---|---|
| 0 102 417 A1 | 3/1984 | European Pat. Off. . |
| 0 434 227 A1 | 6/1991 | European Pat. Off. . |
| 0 679 373 A2 | 11/1995 | European Pat. Off. . |
| 650947 | 3/1951 | United Kingdom . |
| A1145005 | 3/1965 | United Kingdom . |
| WO 82/03069 | 9/1982 | WIPO . |

(List continued on next page.)

OTHER PUBLICATIONS

Journal of Vacuum Science and Technology A11(6)(1993).
L. You, et al., Chemical Perspectives of Microelectronic Materials III Symposium (1992).
J. Apl. Pol. Sci., 13, 2325 Chow, et al.
Chow, S.W., "Poly (α,α,α',α'-tetrafluoro–p–xylylene)", *Journal of Applied Polymer Science*, vol. 13, pp. 2325–2332, 1969.
You, L. et al., "Vapor Deposition fo Parylene Films From Precursors", *Chemical Perspectives of Microelectronic Materials III Symposium*.
Mikami Takashi, "Quartz Crystal Oscillator Type Radical Beam Monitor", *Patent Abstracts of Japan*, Patent No. 07050258.
International Search Report.

*Primary Examiner*—Ronald C. Capossela
*Attorney, Agent, or Firm*—Mintz, Levin, Cohn, Ferris, Glovsky and Popeo, P.C.

[57] ABSTRACT

A method and apparatus for depositing parylene monomer within the interior of a deposition chamber of a parylene deposition system. In certain embodiments, the method comprises the steps of: (a) introducing a cryogenic fluid into the interior of the deposition chamber to cool the surface of the substrate; and (b) introducing the parylene monomer into the interior of the chamber to deposit the parylene monomer onto the surface of the substrate. In some embodiments, the apparatus comprises: a deposition chamber; a pumping system, a source of cryogenic fluid, a gas source and at least one support mount disposed within the interior of the deposition chamber. The pumping system reduces the pressure of the interior of the deposition chamber, and the pumping system is in fluid communication with the interior of the deposition chamber. The source of cryogenic fluid is in fluid communication with the interior of the deposition chamber. The gas source is in fluid communication with the interior of the deposition chamber. Optionally, the method or apparatus may include the use of a load lock chamber.

53 Claims, 4 Drawing Sheets

U.S. PATENT DOCUMENTS

| | | |
|---|---|---|
| 3,749,601 | 7/1973 | Tittle . |
| 3,769,806 | 11/1973 | Boissin ................................. 62/55.5 |
| 4,110,392 | 8/1978 | Yamazaki . |
| 4,184,188 | 1/1980 | Briglia . |
| 4,261,762 | 4/1981 | King . |
| 4,323,031 | 4/1982 | Kaplan . |
| 4,362,125 | 12/1982 | Schadler . |
| 4,401,052 | 8/1983 | Baron et al. . |
| 4,468,283 | 8/1984 | Ahmed . |
| 4,495,889 | 1/1985 | Riley . |
| 4,508,055 | 4/1985 | Elton et al. . |
| 4,518,623 | 5/1985 | Riley . |
| 4,577,465 | 3/1986 | Olsen et al. . |
| 4,596,208 | 6/1986 | Wolfson et al. . |
| 4,613,306 | 9/1986 | Bauer et al. . |
| 4,619,844 | 10/1986 | Pierce et al. . |
| 4,683,143 | 7/1987 | Riley . |
| 4,734,533 | 3/1988 | Ungarelli et al. . |
| 4,761,269 | 8/1988 | Conger et al. . |
| 4,783,561 | 11/1988 | Pregaglia et al. . |
| 4,795,838 | 1/1989 | Bornengo et al. . |
| 4,816,608 | 3/1989 | Bornengo et al. . |
| 4,846,998 | 7/1989 | Pohl et al. . |
| 4,853,488 | 8/1989 | Ungarelli et al. . |
| 4,877,433 | 10/1989 | Oshitari . |
| 4,883,020 | 11/1989 | Kasai et al. . |
| 4,886,923 | 12/1989 | Ungarelli et al. . |
| 4,902,572 | 2/1990 | Horne et al. . |
| 4,903,754 | 2/1990 | Hirscher et al. . |
| 4,945,856 | 8/1990 | Stewart . |
| 4,957,781 | 9/1990 | Kanegae et al. . |
| 5,002,011 | 3/1991 | Ohmine et al. . |
| 5,007,372 | 4/1991 | Hattori et al. . |
| 5,015,503 | 5/1991 | Varrin, Jr. et al. . |
| 5,078,091 | 1/1992 | Stewart . |
| 5,078,851 | 1/1992 | Nishihata et al. . |
| 5,079,045 | 1/1992 | Luhmann et al. . |
| 5,088,444 | 2/1992 | Ohmine et al. . |
| 5,091,207 | 2/1992 | Tanaka . |
| 5,112,642 | 5/1992 | Wajid . |
| 5,121,707 | 6/1992 | Kanoo . |
| 5,123,375 | 6/1992 | Hansen . |
| 5,129,360 | 7/1992 | Ahern et al. . |
| 5,151,133 | 9/1992 | Ohmine et al. . |
| 5,167,717 | 12/1992 | Boitnott . |
| 5,186,120 | 2/1993 | Ohnishi et al. . |
| 5,217,755 | 6/1993 | Thebault et al. . |
| 5,221,403 | 6/1993 | Nozawa et al. . |
| 5,228,501 | 7/1993 | Tepman et al. . |
| 5,248,370 | 9/1993 | Tsui et al. . |
| 5,248,380 | 9/1993 | Tanaka . |
| 5,250,092 | 10/1993 | Nakano . |
| 5,250,323 | 10/1993 | Miyazaki . |
| 5,254,171 | 10/1993 | Hayakawa et al. . |
| 5,261,963 | 11/1993 | Basta et al. . |
| 5,262,194 | 11/1993 | Bischer, Jr. et al. . |
| 5,264,039 | 11/1993 | Gobush et al. . |
| 5,266,118 | 11/1993 | Mitra . |
| 5,268,033 | 12/1993 | Stewart . |
| 5,268,202 | 12/1993 | You et al. . |
| 5,270,266 | 12/1993 | Hirano et al. . |
| 5,292,554 | 3/1994 | Sinha et al. . |
| 5,302,767 | 4/1994 | Galley et al. . |
| 5,324,540 | 6/1994 | Terada . |
| 5,344,492 | 9/1994 | Sato et al. . |
| 5,350,453 | 9/1994 | Schlosser . |
| 5,401,316 | 3/1995 | Shiraishi et al. . |
| 5,439,525 | 8/1995 | Peichl et al. . |
| 5,447,799 | 9/1995 | Loh et al. . |
| 5,458,687 | 10/1995 | Shichida et al. . |
| 5,470,802 | 11/1995 | Gnade et al. . |
| 5,534,068 | 7/1996 | Beach et al. . |
| 5,536,317 | 7/1996 | Crain et al. . |
| 5,536,321 | 7/1996 | Olson et al. . |
| 5,536,322 | 7/1996 | Wary et al. . |
| 5,556,473 | 9/1996 | Olson et al. . |

METHOD AND APPARATUS FOR CRYOGENICALLY COOLING A DEPOSITION CHAMBER

BACKGROUND

1. Field of the Invention

The present invention relates generally to a method and apparatus for cryogenically cooling a deposition chamber, and more specifically to such a method and apparatus that can preferentially cool the surface of a substrate onto which a gas is to be deposited.

2. Discussion of the Related Art

Conformal coatings having low dielectric constants and high melting temperatures are desirable for many applications, including the medical, electronics and automotive industries. For example, the components of an automobile that are located beneath the hood (e.g., the carburetor) are exposed to various corrosive gases as well as temperatures in excess of 200° C. for extended periods of time.

Conventionally, layers of parylene polymers have been used as conformal coatings since some of these layers are known to have dielectric constants of about 2.3 and melting temperatures of about 540° C. Parylene polymers are poly-p-xylylenes which may be prepared with a parylene dimer. Parylene polymers generally have a structure:

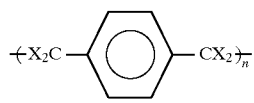

wherein X is typically a hydrogen atom or a halogen atom. The most common forms of parylene dimers include the following:

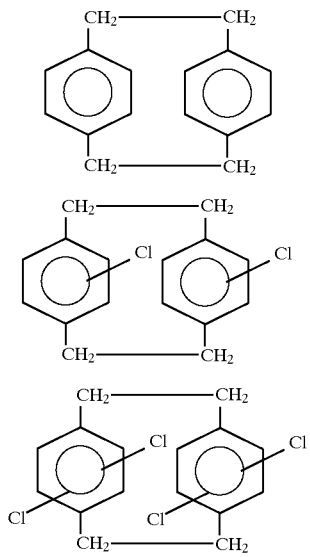

Typically, parylene polymer layers are formed by a vapor deposition method that is performed using a vacuum apparatus. In this method, generally referred to as the Gorham process, the parylene dimer is vaporized and the dimer bond is then cleaved to form parylene monomer having the structure:

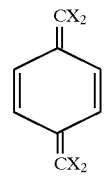

The parylene monomer is then deposited onto the surface of a substrate and polymerization of the monomer occurs spontaneously to form the parylene polymer layer coating. This process and an apparatus appropriate for use with this process are disclosed in U.S. Pat. No. 5,538,758, which is herein incorporated by reference.

The parylene monomer preferentially deposits on relatively cool surfaces. Therefore, it is desirable within the art to provide a method and apparatus for depositing a gas, such as parylene monomer, onto cooled surfaces to yield a layer of material, such as a parylene polymer layer. It is also desirable to provide a method and apparatus for simultaneously depositing parylene monomer onto more than one substrate with minimal limitation on the surface area of the substrate(s).

SUMMARY OF THE INVENTION

In one illustrative embodiment, the present invention provides a method of depositing a gas onto a surface of a substrate. The substrate is disposed within the interior of the deposition chamber. The method comprises the steps of: (a) introducing a cryogenic fluid into the interior of the deposition chamber to cool the surface of the substrate; and (b) introducing the gas into the interior of the chamber to deposit the gas onto the surface of the substrate.

In another illustrative embodiment, the present invention provides a method of depositing parylene monomer within the interior of a deposition chamber of a parylene deposition system. The method comprises the steps of: (a) introducing a cryogenic fluid into the interior of the deposition chamber so that the cryogenic fluid cools at least the surface of a substrate disposed within the interior of the deposition chamber to a reduced temperature; (b) heating walls of the interior of the deposition chamber to a temperature greater than the reduced temperature of the surface of the substrate; and (c) introducing the parylene monomer into the interior of the deposition chamber so that the parylene monomer preferentially deposits onto the surface of the substrate.

In further illustrative embodiment, the present invention provides an apparatus for depositing a gas. The apparatus comprises: a deposition chamber; a pumping system, a source of cryogenic fluid, a gas source and at least one support mount for a substrate disposed within the interior of the deposition chamber. The pumping system reduces the pressure of the interior of the deposition chamber, and the pumping system is in fluid communication with the interior of the deposition chamber. The source of cryogenic fluid is in fluid communication with the interior of the deposition chamber. The gas source is in fluid communication with the interior of the deposition chamber.

In yet a further illustrative embodiment, the present invention provides an apparatus for depositing parylene monomer. The apparatus comprises: a deposition chamber; a vacuum pump, a source of cryogenic fluid, a source of parylene monomer and at least one support mount for a substrate disposed within the interior of the deposition chamber. The vacuum pump reduces the pressure of the interior of the first deposition chamber and is in fluid communication with the interior of the first deposition chamber. The source of a cryogenic fluid is in fluid communication with the interior of the first deposition chamber. The source of parylene monomer is in fluid communication with the interior of the deposition chamber.

In another illustrative embodiment, the present invention provides a method of depositing a gas onto a surface of a substrate. The substrate is disposed within an interior of a deposition chamber. The method comprises the steps of: (a) cooling the surface of the substrate without clamping the substrate to a support; and (b) introducing the gas into the interior of the chamber to deposit the gas onto the surface of the substrate.

In contrast to certain related art systems, the present invention provides the advantage that clamping of the substrate (e.g., electro-clamping, gravitational clamping and the like) is not used to cool the surface of the substrate. Instead, the substrate can be cooled to a temperature sufficient to deposit a gas without clamping the substrate to the support or otherwise bringing the substrate into close contact with the support.

It is another advantage of the present invention that a relatively large surface area of one or more substrates can be cooled to appropriate temperatures prior to deposition of the parylene monomer.

DETAILED DESCRIPTION

Figure 1:
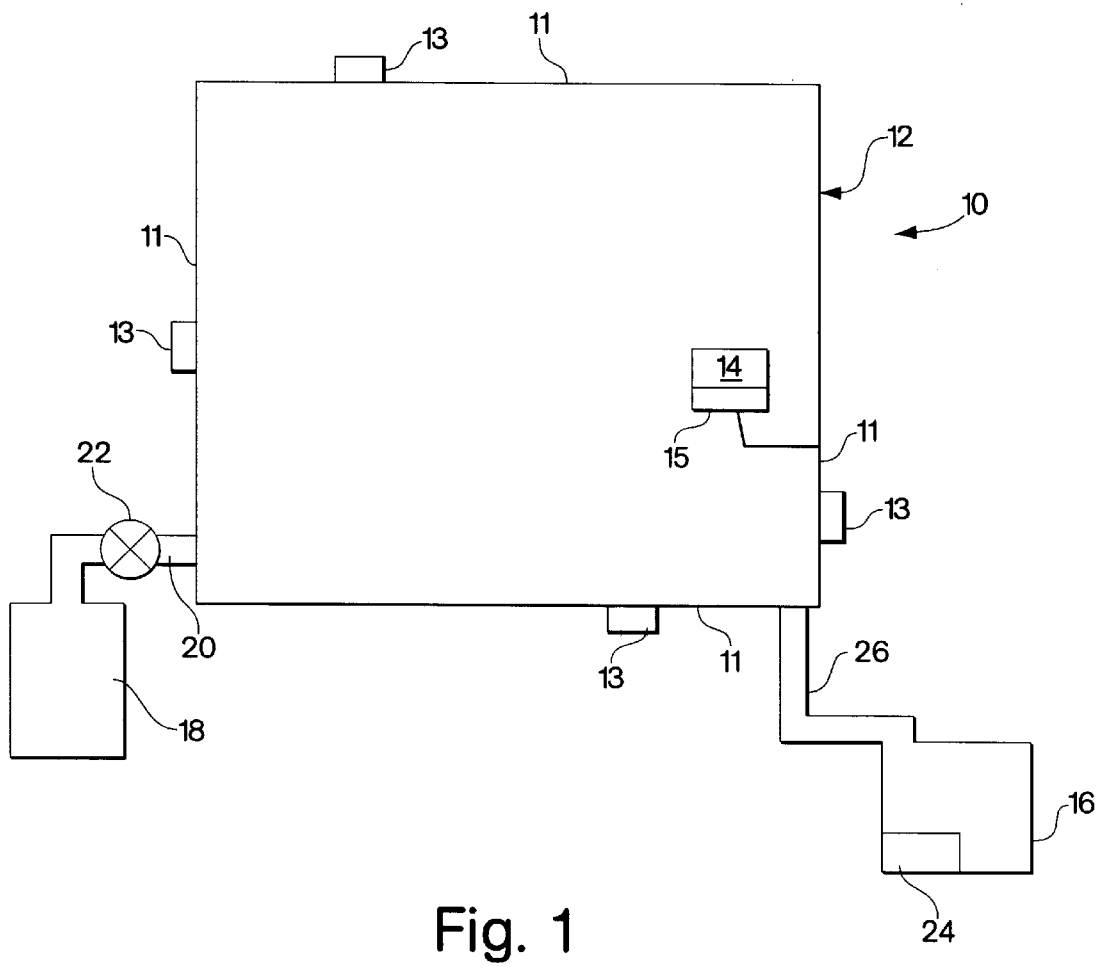
FIG. 1 is a cross-sectional view of one embodiment of an apparatus according the present invention.

In one aspect, the present invention relates to a parylene monomer deposition apparatus 10 as shown in FIG. 1. Apparatus 10 includes a deposition chamber 12 having walls 11 with heaters 13 in thermal communication therewith. A substrate 14 is disposed within the interior of chamber 12 and held in place by a support mount 15. Support mount 15 may take on any shape so long as it is capable of supporting substrate 14 during the coating process as described herein. Preferably, support mount 15 is chemically inert to substrate 14. In alternate embodiments, substrate 14 may be coated using the tumbling technique known to those skilled in the art. In these embodiments, chamber 12 may not include mount 15.

Pumping system 16 is in fluid communication with chamber 12 and can reduce the pressure of the interior of chamber 12 to pressures less than atmospheric pressure. Apparatus 10 further includes a cryogenic fluid source 18 that is in fluid communication with the interior of chamber 10 such that source 18 is capable of supplying a cryogenic fluid to the interior of chamber 12.

A "cryogenic fluid" as used herein denotes a fluid that is capable of reducing the temperature of the surface of substrate 14 to temperatures below room temperature. Preferably, a cryogenic fluid can reduce the temperature of the surface of substrate 14 to less than about 40° C., more preferably less than about 10° C. and most preferably less than about—15° C. Furthermore, a cryogenic fluid should be chemically inert to substrate 14. In addition, the cryogenic fluid should have a water content low enough that exposure of the cryogenic fluid to substrate 14 according to the processes described herein results in substantially no water being left on the surface of substrate 14. Preferably, prior to entering deposition chamber 12, the water content of the cryogenic fluid is at most about 500 parts per million (ppm) water, more preferably at most about 200 ppm and most preferably at most about 5 ppm. It is to be noted that, due to their relatively low temperatures, cryogenic fluids usually freeze out other impurites, such as oils. Deposition of these impurities on the surface of the substrate can interfere with the processes of the present invention. Therefore, the comparatively low concentration of these impurities in cryogenic fluids is advantageous because it reduces the likelihood that contaminants will be deposited on the surface of the substrate during the deposition processes described herein.

A cryogenic fluid may be in the form of a liquid, a gas, a supercritical liquid or any combination thereof. Cryogenic fluids appropriate for use in the present invention include, but are not limited to, liquid nitrogen, liquid carbon dioxide, liquid helium and other such cryogenic fluids that are known to those skilled in the art as well as vapors thereof formed by heating as the cryogenic fluid is transferred from source 18 to the interior of chamber 12, as discussed below.

Cryogenic fluid source 18 may be placed in fluid communication with chamber 10 using any device known to those skilled in the art. Such devices include, for example, pipes, tubes and other such devices that are known to those skilled in the art. Typically, a pipe or tube 20 is used to provide this fluid communication. In certain embodiments, one or more valves 22 may be used to control the flow of cryogenic fluid from source 18 to deposition chamber 12. It is to be noted that, while FIG. 1 depicts source 18 disposed outside the interior of chamber 12, in certain embodiments, source 18 may be located within the interior of chamber 12. The location of cryogenic fluid source 18 is limited only in that it should be in fluid communication with the interior of source 12 and that it should not interfere with the pumping out of chamber 12 subsequent to cooling the surface of substrate 14 or the deposition of a gas on substrate 14.

Pumping system 16 is usually at least one vacuum pump 24 placed in fluid communication with chamber 12 by a tube or a pipe 26. In certain embodiments, vacuum pump 24 may be an oilless pump. To reduce the pressure of the interior of chamber 12, a liquid nitrogen trap 28 may be placed between pump 24 and chamber 12. Alternate embodiments will be readily apparent to those skilled in the art and are intended to be within the scope of the present invention.

The surface of substrate 14 may be formed from any material onto which parylene polymer may be deposited. These materials may include electrically conductive and electrically non-conductive materials. The particular material from which the surface of substrate 14 is formed depends upon the application, and such materials are known to those skilled in the art. For example, the surface of substrate layer 14 may be formed from organic materials or inorganic materials including, but not limited to, aluminum, iron, steel, molybdenum, aluminum oxide, titanium oxide, lead oxide, copper oxide, iron oxide, beryllium oxide, manganese oxide, tungsten oxide, tantalum oxide, vanadium oxide, silicones, natural rubbers, plastics, plastic composites, cellulosic materials, epoxy-containing compounds, thermosetting compounds, thermoplastic compounds, oxides of silicon (e.g., fly ash, hydrated silica, silica, quartz, aerogels, xerogels and fumed silica) and the like. Furthermore, the surface of substrate 14 may comprise gallium arsenide or other such semiconductors formed from more than one element.

The surface of substrate layer 14 may also be formed from a vacuum compatible liquid. By "vacuum compatible" it is herein meant to refer to a material that has a vapor pressure at the operating temperature of the vacuum chamber used such that the minimum pressure to which the vacuum chamber can be pumped is independent of the presence of the vacuum compatible material. One example of a vacuum compatible liquid is gamma-methacryloxypropyltrimethoxysilane.

In certain embodiments, substrate 14 may be a printed circuit board, a silicon backboard, a fiberglass backboard, a silicon wafer, paper, a key pad, a catheter, a pacemaker cover, a subcutaneous probe, a bird feather, a silicone O-ring, parts of a mechanical apparatus, such as an automobile, or the like.

Figure 2:
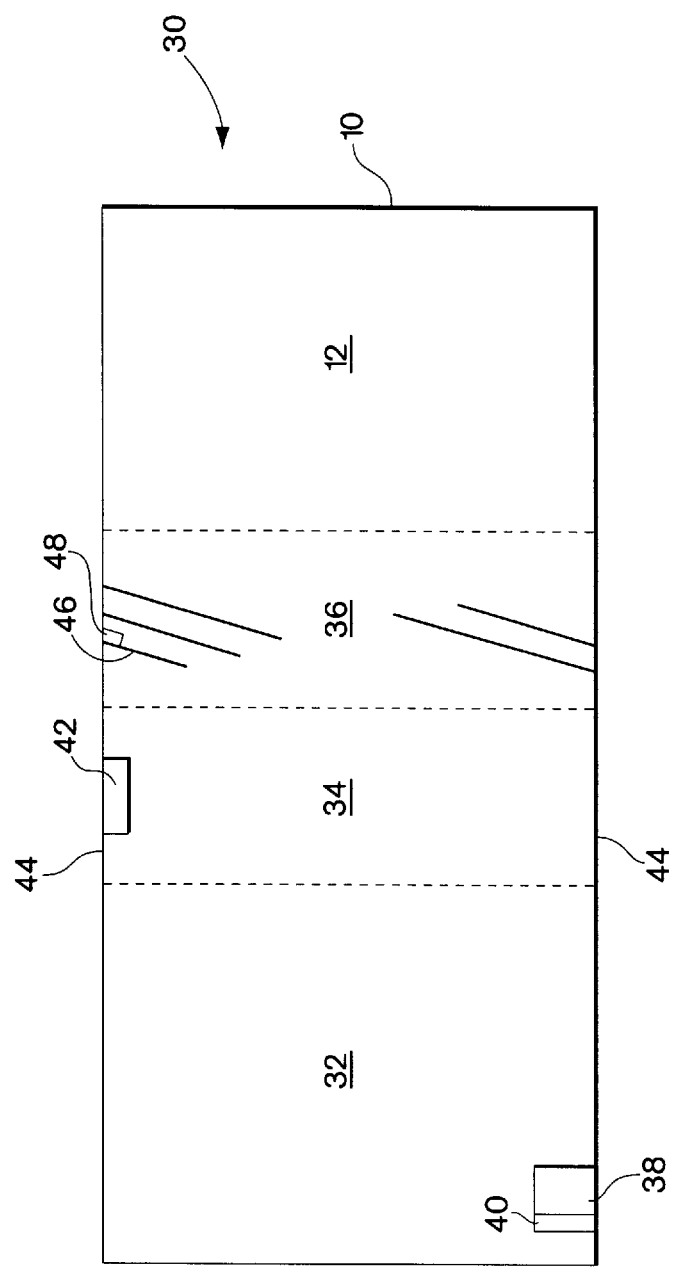
FIG. 2 is a cross-sectional view of another embodiment of an apparatus according to the present invention.

FIG. 2 shows one embodiment of a deposition system 30 according to the present invention. System 30 includes deposition apparatus 10 having the features substantially as described above. System 30 further includes a vaporization chamber 32, a pyrolysis zone 34 and a post-pyrolysis zone 36. Vaporization chamber 32 is in fluid communication with pyrolysis zone 34, and zone 34 is in fluid communication with post-pyrolysis zone 36. Zone 36 is also in fluid communication with the interior of deposition apparatus 12.

Vaporization chamber 32 includes a container 38 for holding parylene dimer. A heater 40 is in thermal communication with container 36. Pyrolysis zone 34 includes at least one heater 42 for maintaining the walls 44 of zone 34 at elevated temperature. Post-pyrolysis zone 36 has baffles 46 which are maintained at a temperature of at most room temperature by cooling device 48.

Figure 3:
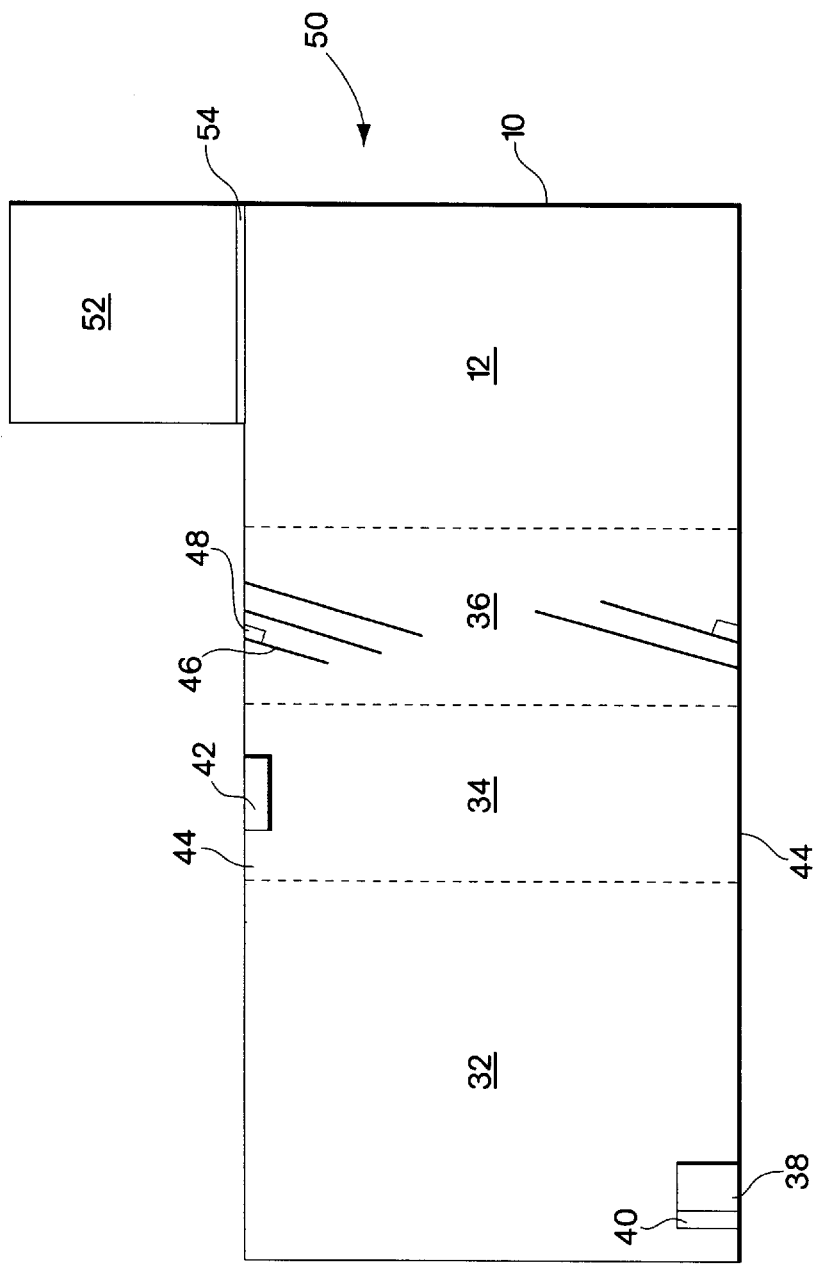
FIG. 3 is a cross-sectional view of yet another embodiment of an apparatus according to the present invention.

FIG. 3 is an alternate embodiment of an deposition system 50 in accordance with the present invention. Elements with the same reference number as disclosed above are substantially similar in apparatus 50. Apparatus 50 further includes a load lock chamber 52 which is adjacent deposition chamber 12 of apparatus 10. Load lock chambers appropriate for use in the present invention are known to those skilled in the art and are intended to be within the scope of the present invention.

Chamber 52 may be placed in fluid communication with deposition chamber 12 of apparatus 10 by opening a seal 54 between chamber 12 and chamber 52. Alternatively, seal 54 may be closed to substantially prevent fluid communication between load lock chamber 52 and deposition chamber 12.

In use, load lock chamber 52 is typically sealed from deposition chamber 12 while the pressure of chamber 12 is reduced (i.e., while chamber 12 is pumped out). The pressure of chamber 52 is maintained at a relatively high pressure while chamber 12 is pumped out (e.g., chamber 52 is kept at atmospheric pressure). Substrate 14 may be placed within chamber 52 and manipulated as desired. The pressure of chamber 52 may then be reduced, and seal 54 may be opened to place chamber 52 in fluid communication with chamber 12. Substrate 14 may then be transferred to chamber 12 and subsequently have a parylene polymer layer formed on the surface of substrate 14, as described herein. In certain embodiments, prior to transferring substrate 14 from chamber 52 to chamber 12, substrate 14 may be cooled using a cryogenic fluid as described herein while it is within chamber 52. Thus, for these embodiments, deposition chamber 12 need not be cooled in order to form a parylene polymer layer on the surface of substrate 14. During the formation of the parylene polymer layer, seal 54 may be used to substantially prevent fluid communication between chamber 52 and chamber 12. Alternatively, seal 54 may be open such that chamber 52 is in fluid communication with chamber 12.

While particular apparatuses have been described herein, one skilled in the art would understand that at least certain aspects of these apparatuses may be varied or modified, and such variations and modifications are intended to be within the scope of the present invention. For example, rather than having heater 42 cleave the parylene dimer (described below), pyrolysis zone 34 may have a plasma source to cleave the parylene dimer. Such plasma sources are disclosed in, for example, Russian Patent Nos. RU 2,000,850 and RU 2,002,519. In some embodiments, apparatus 30 may not include post-pyrolysis zone 36.

Figure 4:
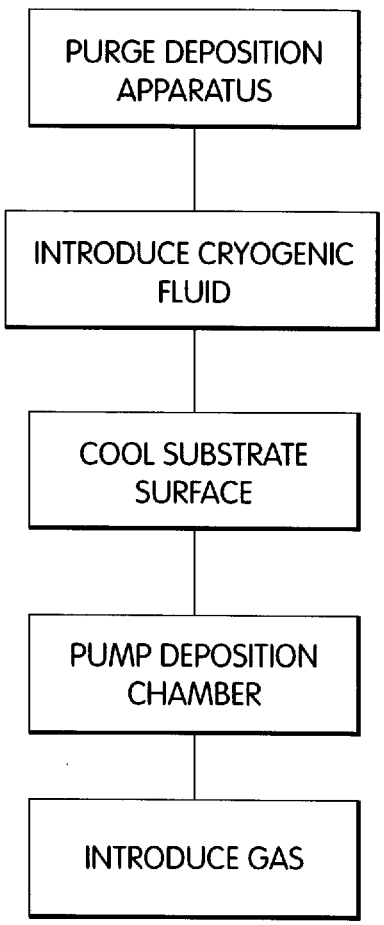
FIG. 4 is a flow chart of one embodiment of a method according to the present invention.

FIG. 4 is a flow chart of one embodiment of the method of the present invention. First, deposition apparatus 10 is purged with a gas at a temperature that does not substantially cool the surface of substrate 14 (e.g., room temperature). This gas should be chemically inert to substrate 14 and should introduce substantially no liquid water or water vapor into apparatus 10 during purging. Preferably, this gas has a water content of at most about 500 ppm, more preferably at most about 200 ppm and most preferably at most about 5 ppm. One example of such a gas appropriate for use in purging apparatus 10 is nitrogen. Other such gases known to those skilled in the art and are intended to be within the scope of the present invention.

A cryogenic fluid is then introduced into deposition apparatus 10 to reduce the temperature of the surface of substrate 14. It is to be noted that, since deposition occurs over a period of time, it may be desirable to cool the surface of substrate 14 to a temperature slightly below the temperature that is desired for deposition. When introduced into the interior of deposition apparatus 10, the cryogenic fluid may be in the form of a liquid, a gas, a supercritical fluid or a combination thereof. For example, while being transferred from source 18 to chamber 12, some liquid nitrogen may boil and become nitrogen vapor. It is to be noted that, if the cryogenic fluid within the interior of chamber 12 is mostly a liquid, the cryogenic fluid need not entirely fill the interior of chamber 12 so long as the temperature of substrate 14 is ultimately reduced to a temperature that increases the rate of deposition of the gas (e.g., parylene monomer) on substrate 14, as discussed below. In certain embodiments, however, it may be desirable to nearly or entirely fill the interior of chamber 12 when the cryogenic fluid is in the form of a liquid.

A period of time is allowed to pass so that the cryogenic fluid is effective in cooling the surface of substrate 14 to a temperature appropriate for deposition. It is to be noted that the temperature of walls 11 need not be cooled to this temperature. Preferably, subsequent to pumping out chamber 12, as discussed below, walls 11 are allowed to heat up to a temperature higher than the temperature of the surface of substrate 14. In some embodiments, heaters 13 may be used to increase the temperature of walls 11 to a temperature higher than the temperature of the surface of substrate 14. Preferably, walls 11 are allowed to heat to a temperature at least from about 10° C. to about 20° C. higher than the surface of substrate 14. More preferably, walls 11 are allowed to heat to a temperature of at least about 20° C. and most preferably from about 20° C. to about 40° C.

The pressure of chamber 12 is then reduced by using pumping system 16. In this step, substantially all cryogenic fluid within the interior of chamber 12 is removed. Optionally, walls 11 of chamber 12 may be heated by heaters 13 to reduce the probability of subsequent gas deposition on walls 11. It is to be noted that the relatively poor heat transfer that occurs in a vacuum reduces the thermal coupling between substrate 14 and walls 11 such that this method is effective in heating walls 11 without substantially increasing the temperature of substrate 14.

The gas is then introduced into the interior of chamber 12 and deposition occurs on the surface of substrate 14. Preferably, during this step, the temperature of walls 11 is comparatively high so that deposition of the gas preferentially occurs on the surface of substrate 14.

As discussed above, in alternate embodiments, deposition chamber 12 need not be cooled. Instead, substrate 14 may be placed within chamber 52. Chamber 52 may then be purged and the cryogenic fluid may then be introduced to chamber 52. The surface of substrate 14 can be cooled, and chamber 52 may then be pumped out. While keeping the surface of substrate 14 at an appropriate temperature for deposition as described herein, substrate 14 may then be transferred to chamber 12. Deposition may then occur as described herein.

In certain embodiments, the method of the present invention may also include rotating substrate 14 to allow a more even deposition of the gas onto the surface of the substrate. Furthermore, in some embodiments, the method of the present invention may include using baffles to control the flow the cryogenic fluid into the interior of chamber 12 to provide a more even cooling of the surface of substrate 14.

Having thus described certain embodiments of the present invention, various alterations, modification and improvements will be apparent to those skilled in the art. Such alterations, modifications and improvements are intended to be within the spirit and scope of the present invention. For example, various combinations of dry gases or cryogenic fluids may be used. In addition, a system may include more than one deposition chamber and/or more than one load lock chamber. Some or all of these load lock chamber(s) and/or deposition chambers may be capable of being placed in fluid communication with each other. In some embodiments, one or more load lock chambers and one or more deposition chambers may be cooled with a cryogenic fluid during the process of forming a parylene polymer layer on the surface of a substrate. Accordingly, the foregoing description is by way of example only and is not intended as limiting. The invention is limited only as defined by the following claims and the equivalents thereto.

What is claimed is:

1. A method of depositing a gas onto a surface of a substrate, the substrate being disposed within an interior of a deposition chamber, the method comprising the steps of:
    (a) introducing a cryogenic fluid into the interior of the deposition chamber to cool the surface of the substrate; and
    (b) introducing the gas into the interior of the chamber to deposit the gas onto the surface of the substrate.

2. The method of claim 1, wherein step (a) includes cooling the surface of the substrate to a temperature of at most about 40° C.

3. The method of claim 1, wherein step (a) includes cooling the surface of the substrate to a temperature of at most about 10° C.

4. The method of claim 1, wherein step (a) includes cooling the surface of the substrate to a temperature of at most about −15° C.

5. The method of claim 1, further comprising, between steps (a) and (b), the step of heating at least some portions of the interior of the deposition chamber other than the surface of the substrate.

6. The method of claim 5, wherein the step of heating includes heating the portions of the interior of the deposition chamber other than the surface of the substrate to a temperature at least about 10° C. higher than a temperature of the surface of the substrate.

7. The method of claim 5, wherein the step of heating includes heating the portions of the interior of the deposition chamber other than the surface of the substrate to a temperature of at least about 20° C.

8. The method of claim 5, wherein the step of heating includes heating the portions of the interior of the deposition chamber other than the surface of the substrate to a temperature of from about 20° C. to about 40° C.

9. The method of claim 1, further comprising, between steps (a) and (b), the step of heating walls of the interior of the deposition chamber to a temperature at least about 20° C. higher than a temperature of the surface of the substrate.

10. The method of claim 9, wherein step (a) includes cooling the surface of the substrate to a temperature of at most about 40° C.

11. The method of claim 10, wherein step (a) introduces substantially no moisture into the interior of the deposition chamber.

12. The method of claim 1, wherein step (a) introduces substantially no moisture into the interior of the deposition chamber.

13. The method of claim 1, further comprising, between step (a) and step (b), the step of gasifying the cryogenic fluid so that substantially no liquid cryogenic fluid remains in the interior of the deposition chamber.

14. The method of claim 13, further comprising, after the step gasifying, the step of removing the cryogenic fluid from the interior of the deposition chamber.

15. The method of claim 1, further comprising, between step (a) and step (b), the step of removing the cryogenic fluid from the interior of the deposition chamber.

16. A method of depositing parylene monomer within an interior of a deposition chamber of a parylene deposition system, the method comprising the steps of:
    (a) introducing a cryogenic fluid into the interior of the deposition chamber so that the cryogenic fluid cools at least a surface of a substrate disposed within the interior of the deposition chamber to a reduced temperature;
    (b) heating walls of the interior of the deposition chamber to a temperature greater than the reduced temperature of the surface of the substrate; and
    (c) introducing the parylene monomer into the interior of the deposition chamber so that the parylene monomer preferentially deposits onto the surface of the substrate.

17. The method of claim 16, wherein step (a) cools the surface of the substrate to a reduced temperature of at most about 40° C.

18. The method of claim 17, wherein step (b) heats the walls of the interior of the deposition chamber to a temperature at least about 20° C. higher than a temperature of the surface of the substrate.

19. The method of claim 18, wherein step (c) includes the steps of:
    gasifying parylene dimer to form gasified parylene dimer; and
    cleaving the gasified parylene dimer to form the parylene monomer.

20. The method of claim 19, wherein the step of gasifying includes vaporizing the parylene dimer.

21. The method of claim 19, wherein the step of cleaving include pyrolyzing the parylene dimer.

22. The method of claim 19, wherein the step of cleaving includes using a plasma.

23. The method of claim 16, wherein step (a) includes cooling the surface of each of a plurality of substrates disposed within the interior of the deposition chamber.

24. The method of claim 16, further comprising, between steps (a) and (b), the step gasifying the cryogenic fluid so that substantially no liquid cryogenic fluid remains in the interior of the deposition chamber.

25. The method of claim 24, further comprising, after the step gasifying, the step of removing the cryogenic fluid from the interior of the deposition chamber.

26. The method of claim 16, wherein step (a) includes cooling the surface of an automobile part.

27. The method of claim 16, further comprising, between step (a) and step (b), the step of removing the cryogenic fluid from the interior of the deposition chamber.

28. An apparatus for depositing a gas, comprising:
- a deposition chamber having an interior and an exterior;
- a pumping system for reducing a pressure of the interior of the deposition chamber, the pumping system being in fluid communication with the interior of the deposition chamber;
- a support mount for a substrate, the support mount being disposed within the interior of the deposition chamber;
- a source of cryogenic fluid in fluid communication with the interior of the deposition chamber; and
- a gas source in fluid communication with the interior of the deposition chamber.

29. The apparatus of claim 28, wherein the pumping system comprises a vacuum pump.

30. The apparatus of claim 28, further comprising a plurality of support mounts for mounting a substrate.

31. The apparatus of claim 28, wherein the source of the cryogenic fluid comprises a tank of liquid nitrogen.

32. The apparatus of claim 28, wherein the source of cryogenic fluid comprises a container of liquid carbon dioxide.

33. The apparatus of claim 28, wherein the gas source is a source of parylene monomer.

34. The apparatus of claim 33, wherein the gas source comprises:
- a chamber for gasifying parylene dimer to form gasified parylene dimer; and
- a chamber for cleaving the gasified parylene dimer to form the parylene monomer, the chamber for cleaving being in fluid communication with the chamber for gasifying.

35. The apparatus of claim 28, further comprising a heater in thermal communication with portions of the interior of the deposition chamber other than the support.

36. The apparatus according to claim 28, further comprising a load lock chamber capable of being placed in fluid communication with the deposition chamber.

37. The apparatus according to claim 36, further comprising a seal disposed between the load lock chamber and the deposition chamber.

38. The apparatus according to claim 28, further comprising a load lock chamber capable of being placed in fluid communication with the first deposition chamber.

39. The apparatus according to claim 38, further comprising a seal disposed between the load lock chamber and the first deposition chamber.

40. An apparatus for depositing parylene monomer, comprising
- a first deposition chamber having an interior and an exterior;
- a vacuum pump in fluid communication for reducing a pressure of the interior of the first deposition chamber, the vacuum pump being in fluid communication with the interior of the first deposition chamber;
- a support mount for mounting a substrate, the support being disposed within the interior of the first deposition chamber;
- a source of a cryogenic fluid in fluid communication with the interior of the first deposition chamber; and
- a source of parylene monomer in fluid communication with the interior of the deposition chamber.

41. The apparatus of claim 40, further comprising a plurality of support mounts for a substrate.

42. The apparatus of claim 40, wherein the source of cryogenic fluid comprises a tank of liquid nitrogen.

43. The apparatus of claim 40, wherein the source of cryogenic fluid comprises liquid carbon dioxide.

44. The apparatus of claim 40, wherein the source of parylene monomer comprises:
- a chamber for gasifying parylene dimer to form gasified parylene dimer; and
- a chamber for cleaving the gasified parylene dimer to form the parylene monomer, the chamber for cleaving being in fluid communication with the chamber for gasifying.

45. The apparatus of claim 40, wherein the source of parylene monomer comprises:
- a vaporization chamber for forming vaporized parylene dimer; and
- a pyrolysis chamber for forming the parylene monomer, the pyrolysis chamber being in fluid communication with the vaporization chamber.

46. The apparatus of claim 45, wherein the source of parylene monomer further comprises a post-pyrolysis chamber in fluid communication with the pyrolysis chamber and the first deposition chamber.

47. The apparatus of claim 40, further comprising a heater in thermal communication with the interior of the first deposition chamber, the heater being thermally isolated from the support mount.

48. The apparatus of claim 40, further comprising a second deposition chamber in fluid communication with the source of cryogenic fluid.

49. The apparatus of claim 40, wherein the at least one substrate comprises an automobile part.

50. A method of depositing a gas onto a surface of a substrate, the substrate being disposed within an interior of a deposition chamber, the method comprising the steps of:
- (a) cooling the surface of the substrate without clamping the substrate to a support; and
- (b) introducing the gas into the interior of the chamber to deposit the gas onto the surface of the substrate.

51. A method of depositing a gas onto a surface of a substrate, the substrate being disposed within an interior a load lock chamber, the method comprising the steps of:
- (a) introducing a cryogenic fluid into the interior of the load lock chamber to cool the surface of the substrate to form a cooled substrate;
- (b) transferring the cooled substrate to an interior of a deposition chamber; and
- (c) introducing the gas into the interior of the deposition chamber to deposit the gas onto the surface of the substrate.

52. The method according to claim 51, further comprising the step of:
introducing a cryogenic fluid into the interior of the deposition chamber.

53. The method according to claim 52, further comprising the step of:
heating walls of the deposition chamber to a temperature greater than the temperature of the cooled substrate.

* * * * *